(12) United States Patent
Knapp et al.

(10) Patent No.: US 7,833,906 B2
(45) Date of Patent: Nov. 16, 2010

(54) TITANIUM SILICON NITRIDE DEPOSITION (75) Inventors: Martin A. Knapp, Laufen (DE); Guido Probst, Bautzen (DE)

(73) Assignee: ASM International N.V. (NL)

( * ) Notice: Subject to any disclaimer, the term of this patent is extended or adjusted under 35 U.S.C. 154(b) by 0 days.

(21) Appl. No.: 12/333,161

(22) Filed: Dec. 11, 2008

(65) Prior Publication Data
US 2010/0151681 A1 Jun. 17, 2010

(51) Int. Cl.
H01L 21/44 (2006.01)
(52) U.S. Cl. ............... 438/680; 438/683; 438/685; 438/785; 257/E21.296
(58) Field of Classification Search ............ 438/680, 438/683, 685, 785
See application file for complete search history.

(56) References Cited

U.S. PATENT DOCUMENTS

| | | | |
|---|---|---|---|
| 2,865,791 A | 12/1958 | Ruppet et al. |
| 4,188,444 A | 2/1980 | Landau |
| 4,262,631 A | 4/1981 | Kubacki |
| 4,277,320 A | 7/1981 | Beguwala et al. |
| 4,279,947 A | 7/1981 | Goldman et al. |
| 4,298,629 A | 11/1981 | Nozaki et al. |
| 4,363,828 A | 12/1982 | Brodsky et al. |
| 4,389,973 A | 6/1983 | Suntola et al. |
| 4,402,997 A | 9/1983 | Hogan et al. |
| 4,413,022 A | 11/1983 | Suntola et al. |
| 4,428,975 A | 1/1984 | Dahm et al. |
| 4,495,218 A | 1/1985 | Azuma et al. |
| 4,535,000 A | 8/1985 | Gordon |
| 4,570,328 A | 2/1986 | Price et al. |
| 4,585,671 A | 4/1986 | Kitagawa et al. |
| 4,610,859 A | 9/1986 | Miyagawa et al. |
| 4,684,542 A | 8/1987 | Jasinski et al. |
| 4,699,805 A | 10/1987 | Seelbach et al. |
| 4,715,937 A | 12/1987 | Moslehi et al. |
| 4,720,395 A | 1/1988 | Foster |

(Continued)

FOREIGN PATENT DOCUMENTS

DE 101 32 882 A1 12/2002

(Continued)

OTHER PUBLICATIONS

Hillman et al., "Properties of LPCVD TiN Barrier Layers," Microelectronic Engineering 19 (1992) 375-378.

(Continued)

Primary Examiner—Alexander G Ghyka
(74) Attorney, Agent, or Firm—Knobbe, Martens, Olson & Bear, LLP (57) ABSTRACT Titanium silicon nitride (TiSiN) films are formed in a cyclic chemical vapor deposition process. In some embodiments, the TiSiN films are formed in a batch reactor using $TiCl_4$, $NH_3$ and $SiH_4$ as precursors. Substrates are provided in a deposition chamber of the batch reactor. In each deposition cycle, a TiN layer is formed on the substrates by flowing $TiCl_4$ into the deposition chamber simultaneously with $NH_3$. The deposition chamber is subsequently flushed with $NH_3$ to prepare the TiN layer for silicon incorporation. $SiH_4$ is subsequently flowed into the deposition chamber. Silicon from the $SiH_4$ is incorporated into the TiN layers to form TiSiN. Exposing the TiN layers to $NH_3$ before the silicon precursor has been found to facilitate efficient silicon incorporation into the TiN layers to form TiSiN.

9 Claims, 10 Drawing Sheets

U.S. PATENT DOCUMENTS

| | | |
|---|---|---|
| 4,803,127 A | 2/1989 | Hakim |
| 4,828,224 A | 5/1989 | Crabb et al. |
| 4,834,020 A | 5/1989 | Bartholomew et al. |
| 4,851,095 A | 7/1989 | Scobey et al. |
| 4,855,254 A | 8/1989 | Eshita et al. |
| 4,891,103 A | 1/1990 | Zorinsky et al. |
| 4,935,661 A | 6/1990 | Heinecke et al. |
| 4,943,581 A | 7/1990 | Hidaka et al. |
| 5,015,330 A | 5/1991 | Okumura et al. |
| 5,111,266 A | 5/1992 | Furumura et al. |
| 5,214,002 A | 5/1993 | Hayashi et al. |
| 5,221,556 A | 6/1993 | Hawkins et al. |
| 5,227,329 A | 7/1993 | Kobayashi et al. |
| 5,246,881 A | 9/1993 | Sandhu et al. |
| 5,279,857 A | 1/1994 | Eichman et al. |
| 5,287,205 A | 2/1994 | Yamazaki et al. |
| 5,308,655 A | 5/1994 | Eichman et al. |
| 5,356,673 A | 10/1994 | Schmitt et al. |
| 5,356,821 A | 10/1994 | Naruse et al. |
| 5,389,398 A | 2/1995 | Suzuki et al. |
| 5,389,570 A | 2/1995 | Shiozawa |
| 5,453,858 A | 9/1995 | Yamazaki |
| 5,471,330 A | 11/1995 | Sarma |
| 5,591,494 A | 1/1997 | Sato et al. |
| 5,607,724 A | 3/1997 | Beinglass et al. |
| 5,614,257 A | 3/1997 | Beinglass et al. |
| 5,648,293 A | 7/1997 | Hayama et al. |
| 5,656,531 A | 8/1997 | Thakur et al. |
| 5,672,385 A | 9/1997 | Jimba et al. |
| 5,695,819 A | 12/1997 | Beinglass et al. |
| 5,698,771 A | 12/1997 | Shields et al. |
| 5,700,520 A | 12/1997 | Beinglass et al. |
| 5,723,382 A | 3/1998 | Sandhu et al. |
| 5,741,330 A | 4/1998 | Brauker et al. |
| 5,769,950 A | 6/1998 | Takasu et al. |
| 5,786,027 A | 7/1998 | Rolfson |
| 5,789,030 A | 8/1998 | Rolfson |
| 5,837,580 A | 11/1998 | Thakur et al. |
| 5,849,601 A | 12/1998 | Yamazaki |
| 5,874,129 A | 2/1999 | Beinglass et al. |
| 5,876,797 A | 3/1999 | Beinglass et al. |
| 5,885,869 A | 3/1999 | Turner et al. |
| 5,907,792 A | 5/1999 | Droopad et al. |
| 5,916,365 A | 6/1999 | Sherman |
| 5,925,188 A | 7/1999 | Oh |
| 5,959,326 A | 9/1999 | Aiso et al. |
| 5,959,327 A | 9/1999 | Sandhu et al. |
| 6,015,590 A | 1/2000 | Suntola et al. |
| 6,027,705 A | 2/2000 | Kitsuno et al. |
| 6,056,823 A | 5/2000 | Sajoto et al. |
| 6,083,810 A | 7/2000 | Obeng et al. |
| 6,087,229 A | 7/2000 | Aronowitz et al. |
| 6,103,600 A | 8/2000 | Ueda et al. |
| 6,136,654 A | 10/2000 | Kraft et al. |
| 6,136,690 A | 10/2000 | Li |
| 6,159,828 A | 12/2000 | Ping et al. |
| 6,161,498 A | 12/2000 | Toraguchi et al. |
| 6,171,662 B1 | 1/2001 | Nakao |
| 6,180,462 B1 | 1/2001 | Hsu |
| 6,197,669 B1 | 3/2001 | Twu et al. |
| 6,197,694 B1 | 3/2001 | Beinglass |
| 6,200,893 B1 | 3/2001 | Sneh |
| 6,203,613 B1 | 3/2001 | Gates et al. |
| 6,228,181 B1 | 5/2001 | Yamamoto et al. |
| 6,252,295 B1 | 6/2001 | Cote et al. |
| 6,271,054 B1 | 8/2001 | Ballantine et al. |
| 6,294,399 B1 | 9/2001 | Fukumi et al. |
| 6,326,311 B1 | 12/2001 | Ueda et al. |
| 6,348,420 B1 | 2/2002 | Raaijmakers et al. |
| 6,373,112 B1 | 4/2002 | Murthy et al. |
| 6,385,020 B1 | 5/2002 | Shin et al. |
| 6,390,753 B1 | 5/2002 | De Ridder |
| 6,391,803 B1 | 5/2002 | Kim et al. |
| 6,455,892 B1 | 9/2002 | Okuno et al. |
| 6,468,924 B2 | 10/2002 | Lee et al. |
| 6,503,846 B1 | 1/2003 | Niimi et al. |
| 6,524,650 B1 | 2/2003 | Shimahara et al. |
| 6,528,530 B2 | 3/2003 | Zeitlin et al. |
| 6,537,910 B1 | 3/2003 | Burke et al. |
| 6,551,893 B1 | 4/2003 | Zheng et al. |
| 6,573,184 B2 | 6/2003 | Park |
| 6,585,823 B1 | 7/2003 | Van Wijck |
| 6,589,868 B2 | 7/2003 | Rossman |
| 6,593,219 B2 | 7/2003 | Matsumoto et al. |
| 6,613,695 B2 | 9/2003 | Pomarede et al. |
| 6,638,879 B2 | 10/2003 | Hsich et al. |
| 6,656,282 B2 | 12/2003 | Kim et al. |
| 6,663,332 B1 | 12/2003 | Sluijk et al. |
| 6,746,240 B2 | 6/2004 | De Ridder et al. |
| 6,749,687 B1 | 6/2004 | Ferro et al. |
| 6,814,572 B2 | 11/2004 | Okabe |
| 6,821,825 B2 | 11/2004 | Todd et al. |
| 6,824,816 B2 | 11/2004 | Aaltonen et al. |
| 6,825,134 B2 | 11/2004 | Law et al. |
| 6,924,223 B2 | 8/2005 | Yamasaki et al. |
| 6,962,859 B2 | 11/2005 | Todd et al. |
| 6,991,684 B2 | 1/2006 | Kannan et al. |
| 6,998,686 B2 | 2/2006 | Chau et al. |
| 7,005,392 B2 | 2/2006 | Baum et al. |
| 7,091,085 B2 | 8/2006 | Shea |
| 7,112,488 B2 | 9/2006 | Helm et al. |
| 7,125,582 B2 | 10/2006 | McSwiney et al. |
| 7,172,792 B2 | 2/2007 | Wang et al. |
| 7,192,626 B2 | 3/2007 | Dussarrat et al. |
| 2001/0025605 A1 | 10/2001 | Nagakura |
| 2001/0032986 A1 | 10/2001 | Miyasaka |
| 2002/0047151 A1 | 4/2002 | Kim et al. |
| 2002/0055270 A1 | 5/2002 | Narwankar et al. |
| 2002/0073925 A1 | 6/2002 | Noble et al. |
| 2002/0098627 A1 | 7/2002 | Pomarede et al. |
| 2002/0121242 A1 | 9/2002 | Minami et al. |
| 2002/0124800 A1 | 9/2002 | Moriyama |
| 2002/0160605 A1 | 10/2002 | Kanzawa et al. |
| 2002/0168868 A1 | 11/2002 | Todd |
| 2002/0197831 A1 | 12/2002 | Todd et al. |
| 2003/0003686 A1 | 1/2003 | Boyle et al. |
| 2003/0022528 A1 | 1/2003 | Todd |
| 2003/0059535 A1 | 3/2003 | Luo et al. |
| 2003/0082300 A1 | 5/2003 | Todd et al. |
| 2003/0111013 A1 | 6/2003 | Oosterlaken et al. |
| 2003/0134038 A1 | 7/2003 | Paranjpe |
| 2003/0143328 A1 | 7/2003 | Chen et al. |
| 2003/0143841 A1 | 7/2003 | Yang et al. |
| 2003/0148605 A1 | 8/2003 | Shimogaki et al. |
| 2003/0176047 A1 | 9/2003 | Doan et al. |
| 2004/0009336 A1 | 1/2004 | Marcadal et al. |
| 2004/0025786 A1 | 2/2004 | Kontani et al. |
| 2004/0096582 A1 | 5/2004 | Wang et al. |
| 2004/0121596 A1 | 6/2004 | Pan et al. |
| 2004/0129212 A1 | 7/2004 | Gadgil et al. |
| 2004/0221807 A1 | 11/2004 | Verghese et al. |
| 2004/0224504 A1 | 11/2004 | Gadgil |
| 2004/0235191 A1 | 11/2004 | Hasegawa et al. |
| 2004/0235314 A1 | 11/2004 | Takimoto |
| 2004/0250765 A1 | 12/2004 | Ishizaka et al. |
| 2005/0039680 A1 | 2/2005 | Beaman et al. |
| 2005/0042373 A1 | 2/2005 | Kraus et al. |
| 2005/0045102 A1 | 3/2005 | Zheng et al. |
| 2005/0064684 A1 | 3/2005 | Todd et al. |
| 2005/0079692 A1 | 4/2005 | Samoilov et al. |
| 2005/0080286 A1 | 4/2005 | Wang et al. |
| 2005/0118837 A1 | 6/2005 | Todd et al. |
| 2005/0247986 A1 | 11/2005 | Ko et al. |
| 2005/0250302 A1 | 11/2005 | Todd et al. |

| | | | |
|---|---|---|---|
| 2005/0287806 A1 | 12/2005 | Matsuura | |
| 2006/0060137 A1 | 3/2006 | Hasper et al. | |
| 2006/0068104 A1 | 3/2006 | Ishizaka et al. | |
| 2006/0084283 A1 | 4/2006 | Paranjpe et al. | |
| 2006/0088985 A1 | 4/2006 | Haverkort et al. | |
| 2006/0172556 A1 | 8/2006 | Bather et al. | |
| 2006/0189168 A1 | 8/2006 | Sato et al. | |
| 2006/0193980 A1 | 8/2006 | Hasegawa et al. | |
| 2006/0216928 A1* | 9/2006 | Chung et al. | 438/630 |
| 2007/0077775 A1 | 4/2007 | Hasper et al. | |
| 2007/0084404 A1 | 4/2007 | Verghese et al. | |
| 2008/0003838 A1 | 1/2008 | Haukka et al. | |

FOREIGN PATENT DOCUMENTS

| | | |
|---|---|---|
| EP | 0 368 651 A2 | 5/1990 |
| EP | 0 442 490 A1 | 8/1991 |
| EP | 0 486 047 A2 | 5/1992 |
| EP | 0526779 A1 | 2/1993 |
| EP | 0 747 974 A2 | 12/1996 |
| EP | 1 065 728 A2 | 1/2001 |
| GB | 2 298 313 A | 8/1996 |
| GB | 2 332 564 A | 6/1999 |
| JP | 59078919 A | 1/1982 |
| JP | 57209810 A | 12/1982 |
| JP | 59078918 A | 5/1984 |
| JP | 60043485 A | 3/1985 |
| JP | 60-245233 | 12/1985 |
| JP | 61-095535 | 5/1986 |
| JP | 61153277 A | 7/1986 |
| JP | 62076612 A | 4/1987 |
| JP | 63003414 A | 1/1988 |
| JP | 63003463 A | 1/1988 |
| JP | 64-081311 | 3/1989 |
| JP | 01-179710 | 7/1989 |
| JP | 1217956 A | 8/1989 |
| JP | 1268064 A | 10/1989 |
| JP | 2155225 A | 6/1990 |
| JP | 3091239 A | 4/1991 |
| JP | 3185817 A | 8/1991 |
| JP | 3187215 A | 8/1991 |
| JP | 3292741 A | 12/1991 |
| JP | 4323834 A | 11/1992 |
| JP | 5021378 A | 1/1993 |
| JP | 5062811 A | 3/1993 |
| JP | 5062911 A | 3/1993 |
| JP | 7249618 A | 9/1995 |
| JP | 8242006 A | 9/1996 |
| JP | 11317530 | 11/1999 |
| JP | 2000-100811 | 4/2000 |
| JP | 2004-023043 | 1/2004 |
| JP | 2004-096060 | 3/2004 |
| WO | WO 02/43115 A2 | 5/2002 |
| WO | WO 02/064853 A2 | 8/2002 |
| WO | WO 03/008663 A1 | 1/2003 |
| WO | WO 2004/008491 A2 | 1/2004 |
| WO | WO 2004/008491 A3 | 1/2004 |
| WO | WO 2004/009861 A2 | 1/2004 |

OTHER PUBLICATIONS

Hiltunen et al., "Nitrides of Titanium, Niobium, Tantalum and Molybdenum Grown as Thin Films by the Atomic Layer Epitaxy Method," Thin Solid Films, 166 (1988) 149-154.

Hiramatsu et al., "Formation of TiN films with low Cl concentration by pulsed plasma chemical vapor deposition", *J. Vac. Sci. Technol. A*, vol. 14, No. 3, May/Jun. 1996; pp. 1037-1040.

Ikoma et al., Growth of Si/3C-SiC/Si(100) hetrostructures by pulsed supersonic free jets, Applied Physics Letters, vol. 75, No. 25, pp. 3977-3979, Dec. 1999.

International Search Report dated Nov. 13, 2003 for international patent application No. PCT/US02/02921, filed on Feb. 1, 2002.

International Search Report and Written Opinion for International Application No. PCT/US2006/047805. May 8, 2007.

Ishihara et al., "Low-temperature chemical-vapor-deposition of silicon-nitride from tetra-silane and hydrogen azide," *Materials Research Society Symposium Proceedings*, vol. 284, p. 3-8 (1993).

Iyer, R. Suryanarayanan et al., "A Process Method of Silicon Nitride Atomic Layer Cyclic Deposition," Semicon Taiwan 2001, pp. 17-25.

Kanoh et al., "Low-temperature chemical-vapor-deposition of silicon nitride," *Journal de Physique IV*, vol. 2, p. C2-831-C2-837 (1991).

Nakano et al., "Digital Chemical Vapor Deposition of $SiO_2$," Appl Phys. Lett. 57 (11) Sep. 1990, pp. 1096-1098.

Olivares, J. et al., "Solid-phase crystallization of amorphous SiGe films deposed by LPCVD on SiOs and glass," *Thin Solid Films* 337 (1999), pp. 51-54.

Pintchovski et al., "LPCVD titanium nitride-deposition, properties, and application to ULSI", *Tungsten and Other Refractory Metal for ULSI Application*, No. IV, pp. 275-282, (1989).

Ramanuja, et al., "Synthesis and characterization of low pressure chemically vapor deposited titanium nitride films using $TiCl_4$ and $NH_3$," Materials Letters 57 (2002) 261-269.

Sakaue et al., Digital Chemical Vapor Deposition of $SiO_2$ Using a Repetitive Reaction of Triethylsilane/Hydrogen and Oxidation, Japanese Journal of Applied Materials, vol. 30, No. 1B, Jan. 1990, pp. L 124-L 127.

Sza, VLSI Technology, "Arrhenius plot for polysilicon deposition for different silane partial pressures," (1988) pp. 240-241.

Travis et al., "A scalable submicron contact technology using conformal LPCVD TiN", *iIDEM Conference Proceedings*, Dec. 1990.

Yeh et al., "Low-temperature chemical-vapor-deposition of silicon-nitride film from hexachloro-disilane and hydrazine," *Jpn. J. Appl. Phys.* vol. 35, Part 1, No. 2B, p. 1509-1512 (Feb. 1996).

European Search Report for counterpart EP Application No. 05011705.

Office Action of Dec. 22, 2008 in U.S. Appl. No. 11/096,861, filed Mar. 31, 2005.

Office Action of Jun. 13, 2008 in U.S. Appl. No. 11/096,861, filed Mar. 31, 2005.

Office Action of Aug. 21, 2008 in U.S. Appl. No. 11/843,552, filed Aug. 22, 2007.

* cited by examiner

TITANIUM SILICON NITRIDE DEPOSITION

BACKGROUND

1. Field of the Invention

This invention relates generally to semiconductor fabrication and, more particularly, to forming titanium silicon nitride films.

2. Description of the Related Art

Integrated circuits or other semiconductor devices can include metal features formed in a dielectric material. Over time, the metal can diffuse into the dielectric. This is undesirable for, among other things, device reliability. Diffusion barriers are typically provided between the metal and the dielectric to prevent this metal diffusion.

Titanium nitride (TiN) has been used as a diffusion barrier. However, TiN can still permit some diffusion of metals across a TiN layer. It is believed that the diffusion occurs because of the crystal structure of the TiN layers; metals can diffusion along grain boundaries in the TiN layer.

More amorphous materials or nano-crystalline materials, having very small grains, may provide a more effective barrier against diffusion. Titanium silicon nitride (TiSiN) has been explored as one such material.

Accordingly, research into the development of TiSiN deposition processes is on-going and there is a continuing need for methods for forming TiSiN with desired material properties.

SUMMARY

According to one aspect of the invention, a method is provided for forming a titanium silicon nitride film. The method comprises providing a plurality of semiconductor substrates in a reaction chamber of a batch furnace, wherein the reaction chamber can accommodate 25 or more substrates. Titanium silicon nitride is deposited on the substrates by performing a plurality of deposition cycles. Each deposition cycle comprises the following steps: A) flowing $TiCl_4$ into the chamber while simultaneously flowing $NH_3$ into the chamber, the $NH_3$ flowing into the chamber at a first flow rate; B) stopping the flow of $TiCl_4$; C) flowing $NH_3$ into the chamber at a second flow rate higher than the first flow rate; and D) flowing a silicon precursor into the chamber.

According to another aspect of the invention, a method is provided for forming a titanium silicon nitride film. The method comprises performing a plurality of deposition cycles in a deposition chamber. Each deposition cycle comprises chemical vapor depositing a titanium nitride layer by simultaneously flowing a titanium precursor and a nitrogen-containing reactant into the deposition chamber. Subsequently, a pulse of a reducing agent is pulsed into the deposition chamber. The titanium nitride layer is subsequently exposed to a pulse of a silicon precursor. In some embodiments, the reducing agent is a nitrogen-containing reducing agent.

BRIEF DESCRIPTION OF THE DRAWINGS

The invention will be better understood from the Detailed Description and from the appended drawings, which are meant to illustrate and not to limit the invention, and wherein.

DETAILED DESCRIPTION

One approach for forming TiSiN is to incorporate silicon into TiN. This can be achieved by forming a TiN layer and then exposing the TiN layer to a silicon precursor.

Simple exposure to a silicon precursor is not sufficient to incorporate silicon (Si) into a TiN layer, however. For example, forming a TiN film and then exposing the TiN film to a silicon precursor has been found to result in negligible silicon incorporation into the TiN film. Thus, incorporating silicon into TiN layers and, further, achieving acceptable deposition rates, can be difficult.

The inventors have discovered that exposure of TiN to a reducing agent, preferably a nitrogen-containing reducing agent, before exposure to a silicon precursor, allows silicon to be efficiently incorporated into the TiN film. Examples of nitrogen-containing reducing agents includes hydrazine ($H_2N$—$NH_2$), alkylhydrazines (R—NH—$NH_2$) and dialkylhydrazines ($R_1$—HN—HN—$R_2$) and ammonia. In some referred embodiments, the nitrogen-containing reducing agent is ammonia ($NH_3$).

In some embodiments of the invention, a TiSiN film is formed in a cyclical chemical vapor deposition (CVD) process. In each cycle, a TiN layer is formed by CVD, and the TiN layer is subsequently exposed to an intermediate nitrogen-containing reducing agent pulse and a later silicon precursor pulse. The TiN layer is formed by simultaneously exposing a substrate to a titanium precursor and a nitrogen precursor and thermally decomposing the precursors on the substrate to form TiN. In some embodiments, the titanium precursor is titanium chloride ($TiCl_4$) and the nitrogen precursor is $NH_3$ which are both flowed simultaneously into the deposition chamber containing the substrate. The deposition chamber is then flushed with a nitrogen-containing reducing agent, e.g., ammonia ($NH_3$). The flush prepares the deposited TiN for silicon incorporation. Subsequently, the TiN is exposed to a silicon precursor, e.g., a silicon hydride ($Si_xH_y$) such as monosilane ($SiH_4$). Silicon is incorporated into the TiN layer to form TiSiN.

Advantageously, high incorporation of silicon into the TiN is achieved, along with high deposition rates and good uniformity. Moreover, the properties of the TiSiN film can be advantageously tailored as desired. For example, by varying the exposure of the TiN to the silicon precursor, the resistivity and grain size of the TiSiN film can be varied. In some embodiments, the resistivity and grain size can be varied by varying the exposure to the silicon precursor, e.g., by varying the flow rate of the silicon precursor, varying the number of silicon precursor pulses per cycle and/or varying the duration of the silicon precursor pulse. Advantageously, the deposited TiSiN films can also exhibit excellent oxidation resistance.

Reference will now be made to the Figures, in which like numerals refer to like parts throughout.

Figure 1:
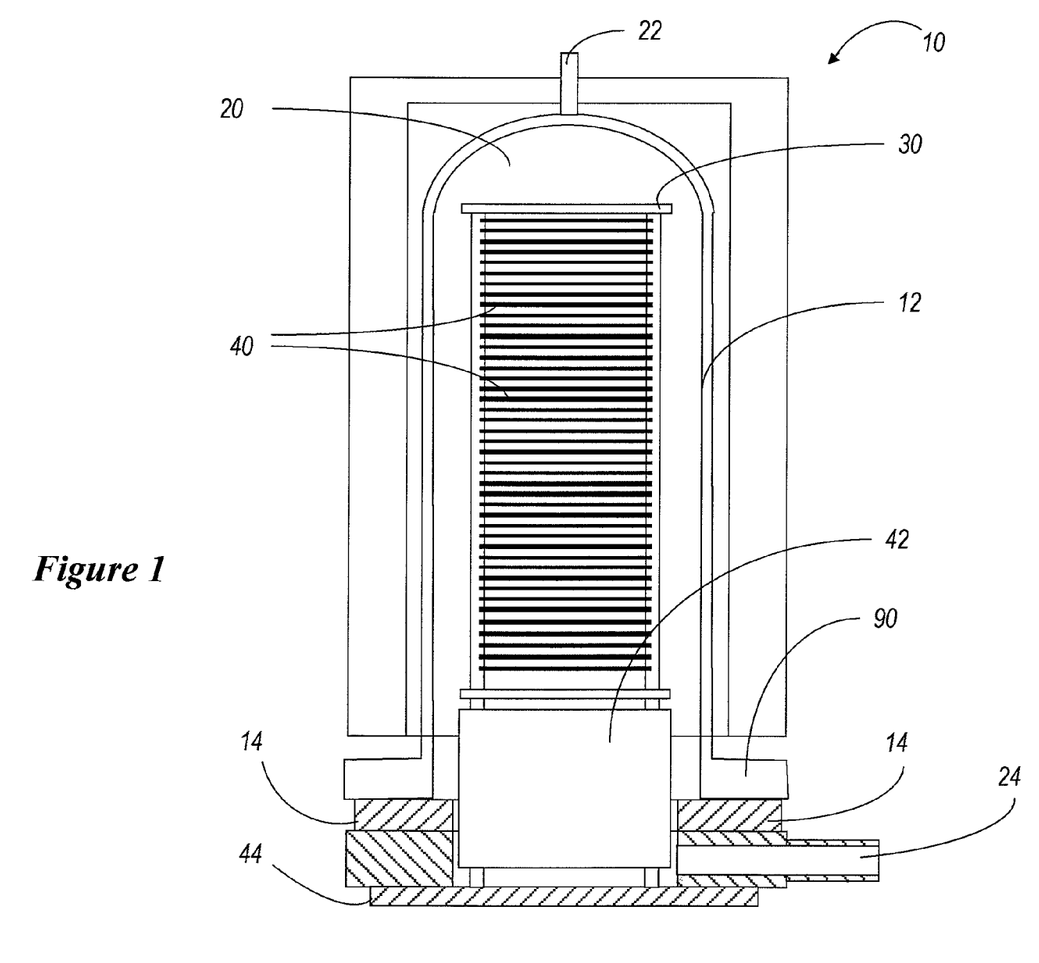
FIG. 1 illustrates a furnace for use with some embodiments of the invention.

With reference to FIG. 1, a reactor 10 for use with some embodiments of the invention is illustrated. The reactor 10 is a vertical furnace reactor, which accommodates substrates 40 vertically separated from one another and which has benefits for efficient heating and loading sequences. The substrates can be, e.g., semiconductor substrates, including silicon wafers. In some embodiments, the reactor 10 can accommodate 25 or more, or 50 or more substrates. Examples of suitable vertical furnaces are the A400™ and A412™ vertical furnaces, commercially available from ASM International, N.V. of Almere, the Netherlands. It will be understood, however, that while preferred embodiments are presented in the context of a vertical batch furnace, the principles and advantages disclosed herein will have application to other types of reactors known in art.

With continued reference to FIG. 1, a tube 12 defines a reaction chamber 20 in the interior of the vertical furnace or reactor 10. The lower end of the tube 12 terminates in a flange 90, which mechanically seals the chamber 20 by contact with a lower support surface 14. Process gases can be fed into the reaction chamber 20 through a gas inlet 22 at the top of the chamber 20 and evacuated out of the chamber 20 through a gas outlet 24 at the bottom of the chamber 20. The reaction chamber 20 accommodates a wafer boat 30 holding a stack of vertically spaced substrates or wafers 40.

The process tube flange 90 can be maintained at an elevated temperature to avoid condensation of process gases on it. It will be appreciated that the elevated temperature can vary from process to process and is preferably chosen based upon the identities of the process gases. Regulation of the temperature of the flange 90 can be achieved by providing it with electrical heaters and a water-cooling system. The water-cooling is desired primarily to avoid overheating of the flange 90 during unloading of a batch of hot wafers 40.

Various systems can be used to supply reactants or precursors to the reaction chamber 20. For example, where the precursor is a gas, it can be flowed directly from a gas source to the chamber 20. The timing and rate of the flow of the gas can be controlled by a programmed controller connected to the reactor 10. The controller in turn controls mass flow controllers in a piping system connected to the chamber 20.

Where the precursor, such as $TiCl_4$, is stored as a liquid, a bubbler can be used to supply the precursor to the chamber 20 in gaseous form. The timing and rate of flow of such a precursor can be regulated by controlling the flow of carrier gas through the liquid in the bubbler and by controlling the temperature of the liquid. It will be appreciated that the quantity of the liquid precursor carried by the carrier gas increases with increasing temperature.

Figure 2:
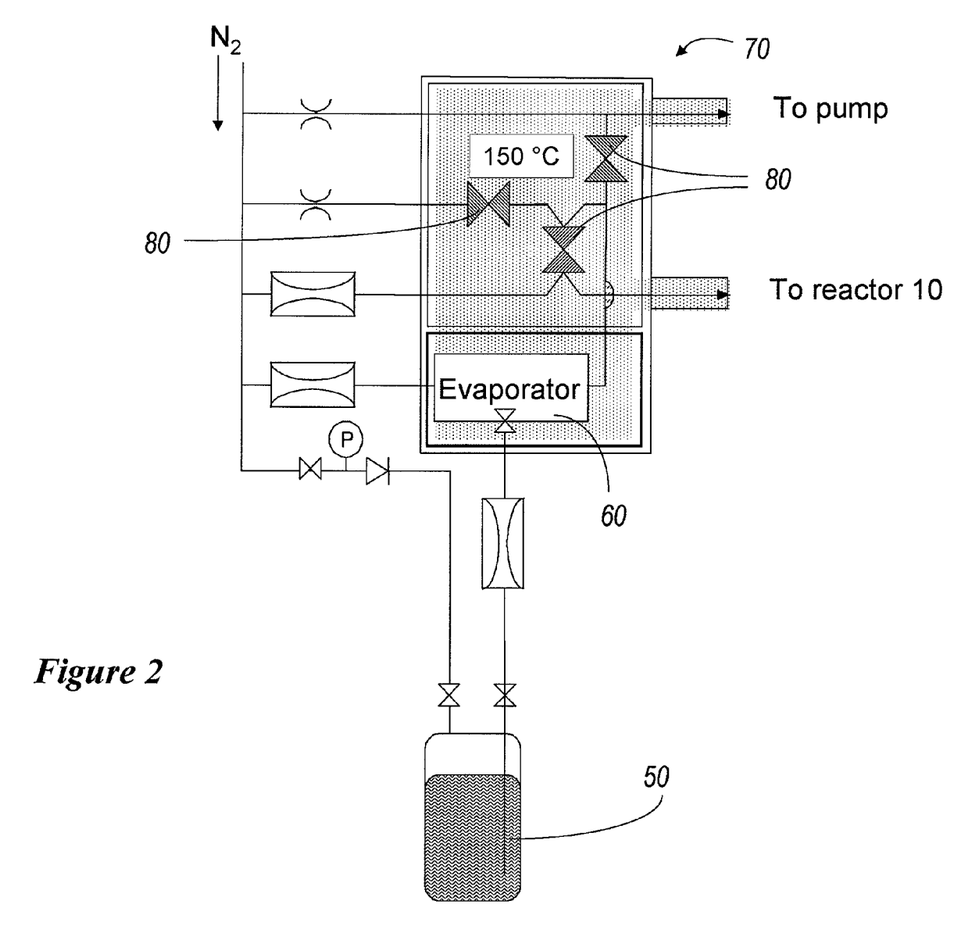
FIG. 2 illustrates a liquid delivery system for use with some embodiments of the invention.

Another system for controlling the flow of liquid precursors, such as $TiCl_4$, is shown schematically in FIG. 2. The liquid precursor is stored in a container 50. Liquid flow control is used to regulate the amount of the liquid precursor flowing into the reactor 10 by regulating the flow of the liquid into an evaporator or vaporizer 60. After being vaporized, well-separated pulses of a precursor can be generated and flowed into the reaction chamber 20 using a valve system 70 comprising valves 80, shown in the upper section of FIG. 2. Preferably, the valves 80 of the valve system 70 are operated at elevated temperatures and have no or minimal dead volume, to provide good separation between the flow of different reactants. Such a valve system is described in further detail in U.S. Pat. No. 6,981,517 of applicant.

Process gases can be introduced into the chamber 20 in various ways. For example, in the reactor illustrated in FIG. 1, gases are introduced into the interior 20 of the reactor 10 at the top, via the top inlet 22, and exhausted at the bottom of the reactor 10, via the exhaust 24.

In other embodiments, an even more uniform distribution of the process gases can be achieved over the length of the tube by using multiple hole injectors for introduction of process gases into the reactor. The multiple hole injectors can have a plurality of holes extending the length of the injector. To counteract the depletion of gases over the length of an injector, the sizes and/or density of the holes can increase with increasing distance from an inlet of gas into the injector. Suitable multiple hole injectors are disclosed in U.S. Pat. No. 6,746,240, issued Jun. 8, 2004, and U.S. patent application Publication No. 2003/0111013 A1. Alternatively, less spacious and cylindrical multiple hole injectors can be used. Such injectors can have, e.g., a diameter of about 25 mm and holes of about 1 mm diameter. In some embodiments, multiple hole injectors are mounted on or beneath the flange 90 at the lower end of the reaction chamber 20 and pointed upwardly.

In some embodiments, a multiple hole injector is not used to introduce a purge gas, because the top part of the reaction chamber 20 may be not effectively purged by an injector that only extends part way up the height of the chamber 20. Preferably, a purge gas is introduced into the chamber 20 at the chamber end that is opposite to the exhaust end, so that the purge gas flows through all regions of the reaction chamber 20 after entry and before being exhausted.

Figure 3:
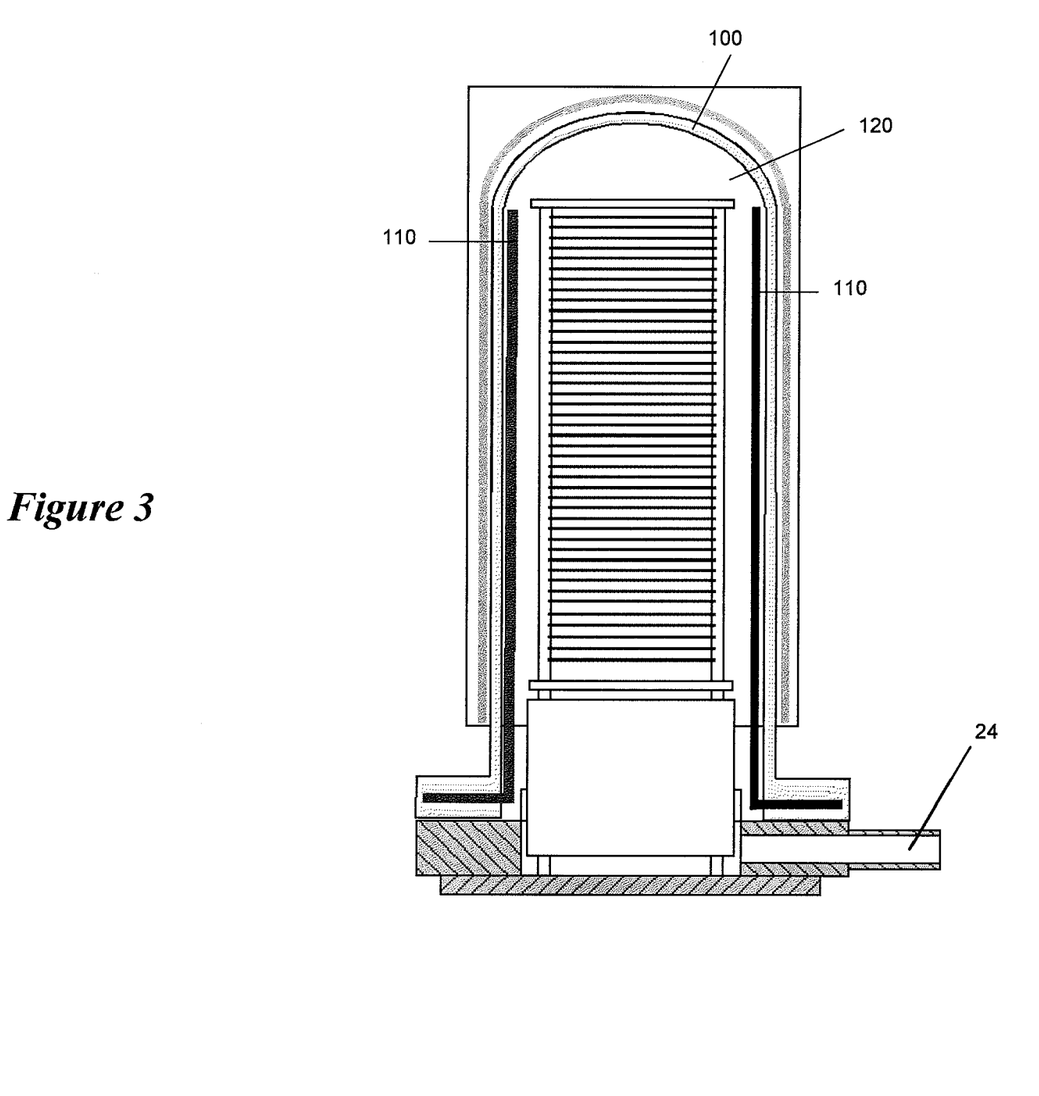
FIG. 3 illustrates another furnace for use with some embodiments of the invention.

With reference to FIG. 3, a reactor set-up with multiple-hole gas injectors is shown. In this design, the process tube 100 is closed at the top. An advantage of this design is that the process tube 100 is simpler in construction than the reactor of FIG. 1 and eventual problems with gas-tightness and the thermal isolation of the top inlet 22 (FIG. 1) can be prevented. Gases in this set-up are introduced through gas injectors 110. Preferably, separate injectors 110 are used for each precursor gas. In the case of TiSiN deposition with titanium, silicon and nitrogen precursors, e.g., $TiCl_4$, $SiH_4$, and $NH_3$, respectively, a different injector 110 is used for each of the process gases. These injectors 110 are preferably multiple hole gas injectors having holes distributed over the height of the tube 100, as discussed above.

An additional injector 110 can be used for a purge gas, preferably an inert gas such as nitrogen gas. The injector 110 for the purge gas is preferably a tube with an open end at its top and without gas discharge holes in its sidewall, so that all the purge gas is discharged at the top of the reaction chamber 120. The purge gas flows downward through the reaction chamber 120 and exits out the exhaust 24 at the bottom of the reaction chamber 120. In other embodiments, the exhaust 24 can be at the top of the reaction chamber 120 and the purge gas can be discharged at the bottom of the reaction chamber 120.

In yet other embodiments, a reaction chamber configuration having an outer process tube and an inner liner can be used. Gas flows in an upward direction inside the liner to the top of the chamber and flows in a downward direction toward an exhaust in a space between the outer surface of the liner and an inner surface of the process tube. The multiple hole injectors are placed inside the liner and a purge gas injector may not be needed. An example of such a reaction chamber configuration is disclosed in U.S. patent application Publication No. 2003/0111013 A1. Advantageously, using the multiple hole gas injectors and reactor set-ups disclosed herein, the evenness of gas distribution into the reaction chamber can be improved, thereby improving the uniformity of deposition results.

Figure 4:
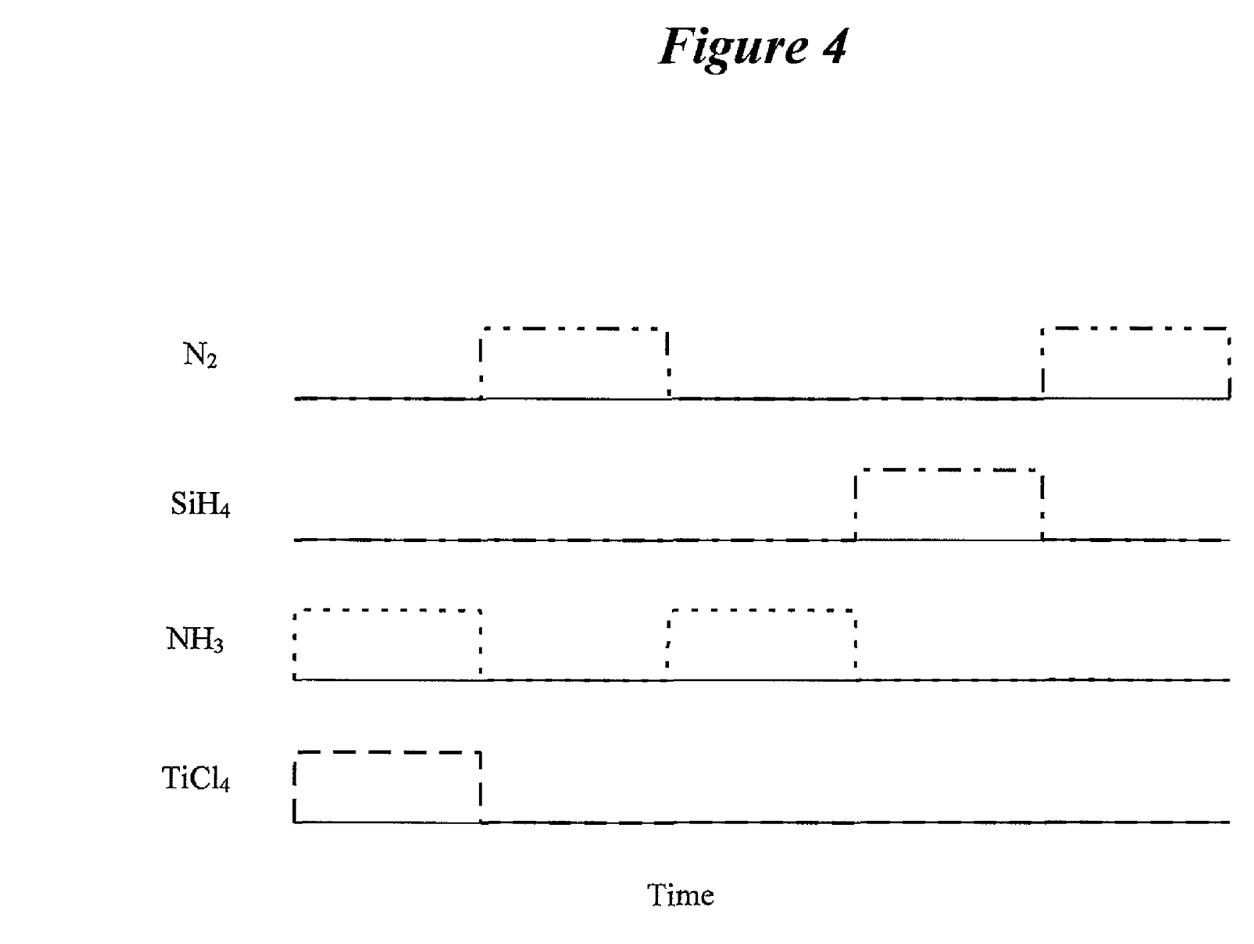
FIG. 4 shows a pulsed chemical vapor deposition sequence according to some embodiments of the invention.

With reference to FIG. 4, a deposition cycle according to some embodiments of the invention is shown. In a first phase of the deposition, substrates in a reaction chamber, such as that illustrated in FIGS. 1 and 3, are exposed to a titanium precursor and a nitrogen precursor to deposit TiN on the substrates. The titanium precursor and the nitrogen precursor can be $TiCl_4$ and $NH_3$, respectively, as illustrated. The reaction chamber is subsequently purged with inert gas, such as $N_2$.

Following the purge, the substrates are exposed to a nitrogen-containing reducing agent, e.g., $NH_3$. Preferably, the reaction chamber is flushed with $NH_3$ during this step. In some embodiments, the flow rate of the nitrogen-containing reducing agent (which may be referred to as the second nitrogen species flow rate) is about 2 times or about 3 times higher in this step than the flow rate of nitrogen precursor during the deposition of the TiN film (which may be referred to as the first nitrogen species flow rate). Advantageously, this $NH_3$ flush has been found to facilitate the incorporation of silicon into the deposited TiN film.

With continued reference to FIG. 4, the reaction chamber is purged with inert gas after the nitrogen-containing reducing agent flush. The substrates are then exposed to a silicon precursor, e.g., a silicon hydride ($Si_xH_y$) including silanes such as monosilane ($SiH_4$), disilane ($Si_2H_6$), and trisilane ($Si_3H_8$). In the illustrated embodiment, the silicon precursor is monosilane. Silicon from the silicon precursor is incorporated into the TiN film to form TiSiN.

Preferably, the TiN film is formed under chemical vapor deposition conditions in which the titanium and nitrogen precursors thermally decompose on a heated substrate. In some embodiments, the deposition temperature is about 400° C. or more, or about 500° C. or more. Advantageously, high deposition rates can be achieved. Preferably, more than a monolayer of TiN is deposited per cycle. In some embodiments, the deposited thickness per cycle can be about 2.0 Å or higher, about 3.0 Å or higher, or about 3.4 Å or higher. Thus, similar thicknesses of TiSiN are formed per cycle. In some embodiments, the deposition temperature is maintained at a constant temperature throughout the deposition.

As discussed herein, performing a flush of the reaction chamber with the reducing agent, e.g., $NH_3$, before exposing a substrate to a silicon precursor has been found to facilitate incorporation of the silicon into TiN films. While the invention is not limited by theory, the TiN deposition is believed to form $TiN_xCl_y$, thereby forming a Cl-rich surface for the deposited film. The reducing agent reduces the $TiN_xCl_y$ and converts the Cl-rich surface to a H-terminated surface and $TiN_xCl_y$ is converted to pure TiN. Silicon from the silicon precursor can react with the H-terminated surface without inhibition, thereby readily forming TiSiN. Advantageously, the lack of inhibition allows silicon to be incorporated into the TiN at moderate temperatures of about 700° C. or less.

It will be appreciated that before the $NH_3$ flush, multiple sub-cycles of TiN deposition can be performed. For example, the substrates in the reaction chamber can be exposed to $TiCl_4$ and $NH_3$ simultaneously in one sub-cycle and this sub-cycle can be repeated multiple times before the $NH_3$ flush. Each sub-cycle may be separated by a removal of reactant from the reaction chamber, e.g., by a purge with inert gas and/or by evacuation of the reaction chamber. In addition, after the $NH_3$ flush, the substrates may be exposed to multiple pulses of the silicon precursor. In some embodiments, the pulses of silicon precursor can be separated by a reactant removal step, e.g., an inert gas purge or an evacuation. In other embodiments, the durations of TiN deposition pulses and the silicon precursor pulse can be varied to achieve a desired amount of TiN deposition relative to silicon incorporation.

Figure 5:
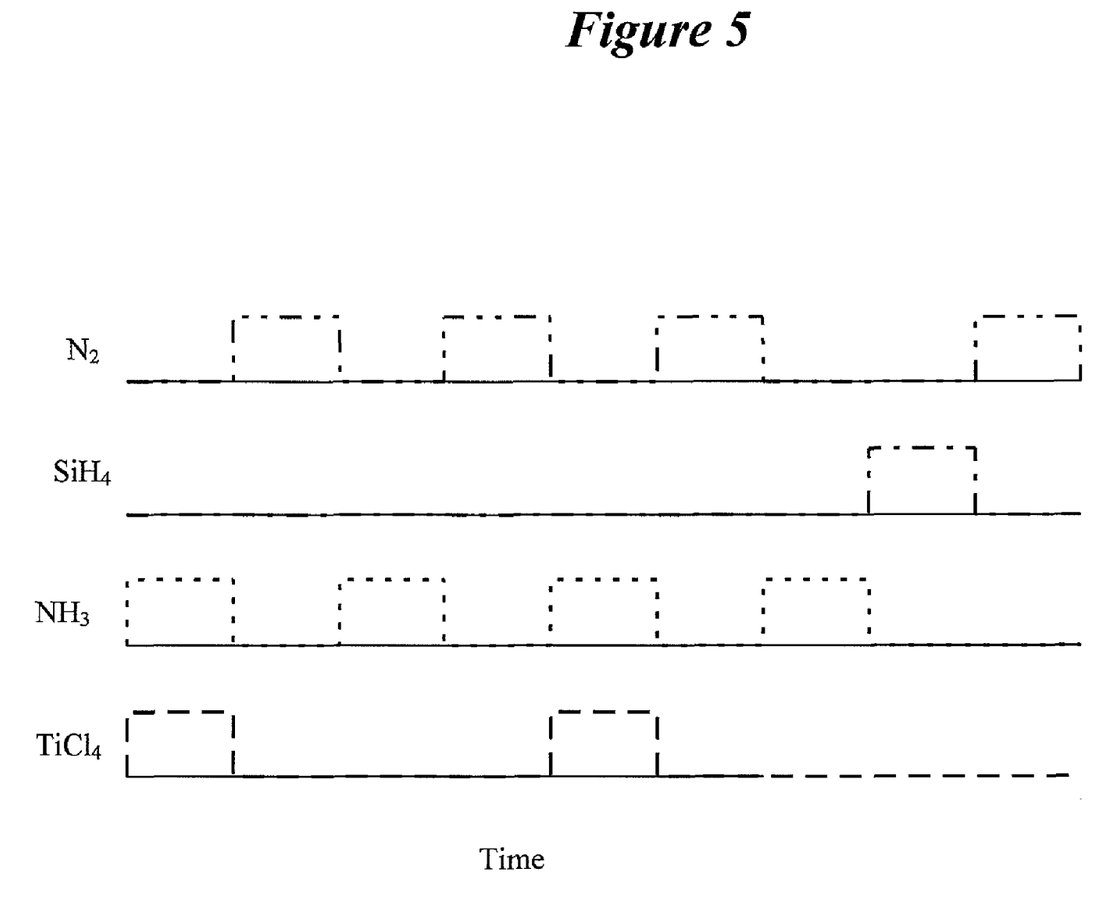
FIG. 5 shows a pulsed chemical vapor deposition sequence according to some other embodiments of the invention.

FIG. 5 illustrates an example of a deposition cycle in which the number of TiN deposition sub-cycles is greater than the number of silicon precursor sub-cycles. With reference to FIG. 5, TiN is deposited in a first sub-cycle using $TiCl_4$ and $NH_3$. The reaction chamber is then purged with inert gas, e.g., $N_2$. After the purge, the reaction chamber is flushed with $NH_3$. A second TiN deposition sub-cycle is then performed, followed sequentially by a $N_2$ purge and a $NH_3$ flush. The deposited TiN is then exposed to a single $SiH_4$ pulse to incorporate silicon into the TiN to form TiSiN.

As noted herein, the inventors have found that appreciable incorporation of silicon into TiN does not occur without performing a $NH_3$ flush step after depositing TiN and before exposing a TiN film to a silicon precursor. Various other deposition sequences investigated by the inventors are shown in FIGS. 6A-6E. FIGS. 6A-6E illustrate the sequence of pulses for a single deposition cycle. A plurality of cycles was performed for each deposition sequence.

Figure 6A:
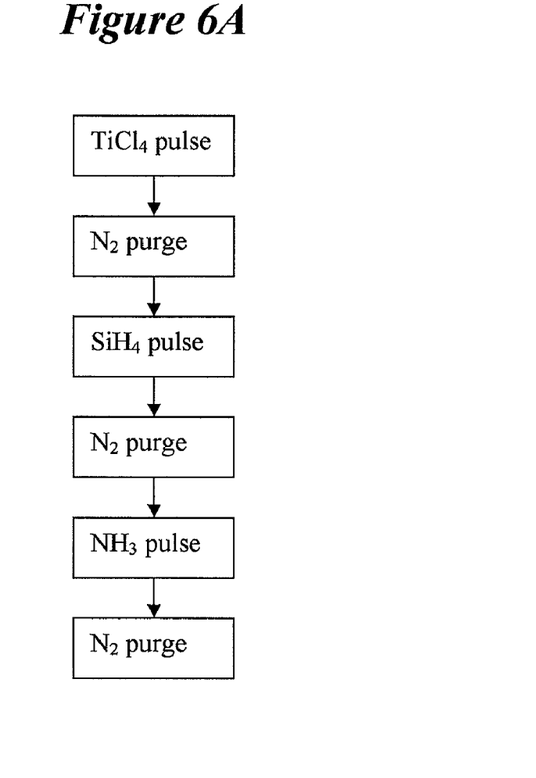
FIGS. 6A-6E show various deposition sequences investigated for forming TiSiN.
Figure 6B:
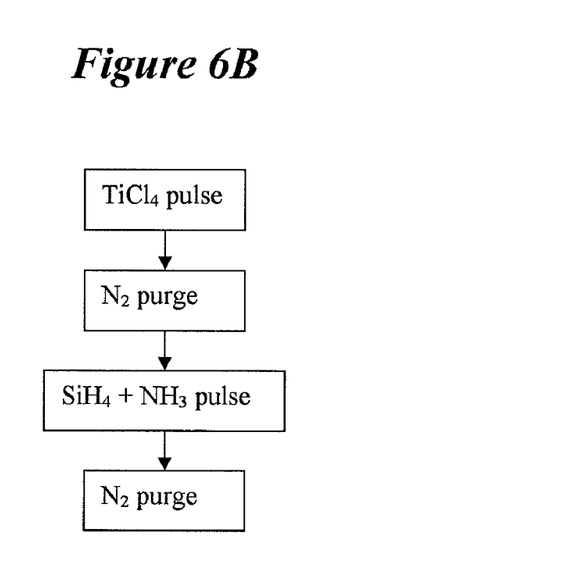
Figure 6C:
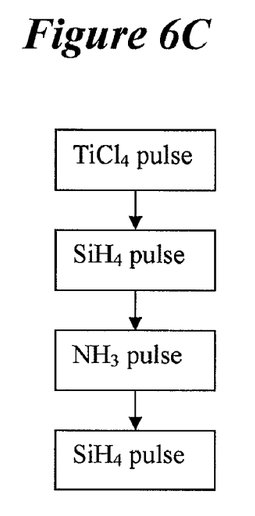

In the sequences shown in FIGS. 6A-6C, $NH_3$ was introduced at times other than between formation of TiN and before the silicon precursor pulse, $SiH_4$. No significant incorporation of silicon was found in the resulting deposited films.

With reference to FIG. 6A, $TiCl_4$, $SiH_4$ and $NH_3$ were separately and sequentially pulsed into a batch reaction chamber. The reaction chamber is purged with $N_2$ between each of these pulses.

With reference to FIG. 6B, $TiCl_4$ was pulsed into the batch reaction chamber, followed by a $N_2$ purge. $SiH_4$ and $NH_3$ were subsequently simultaneously pulsed into the batch reaction chamber. The reaction chamber was subsequently purged with $N_2$.

With reference to FIG. 6C, $TiCl_4$, $SiH_4$, $NH_3$, and $SiH_4$, were separately and sequentially pulsed into a batch reaction chamber. The reaction chamber was not purged between pulses.

Figure 6D:
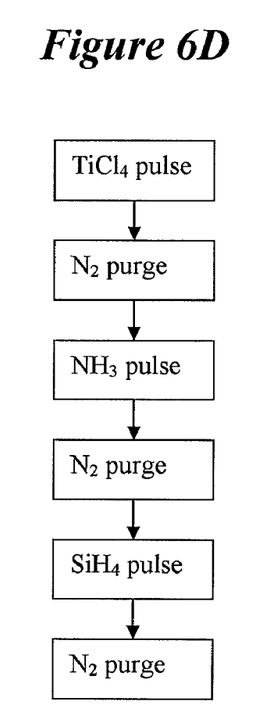
Figure 6E:
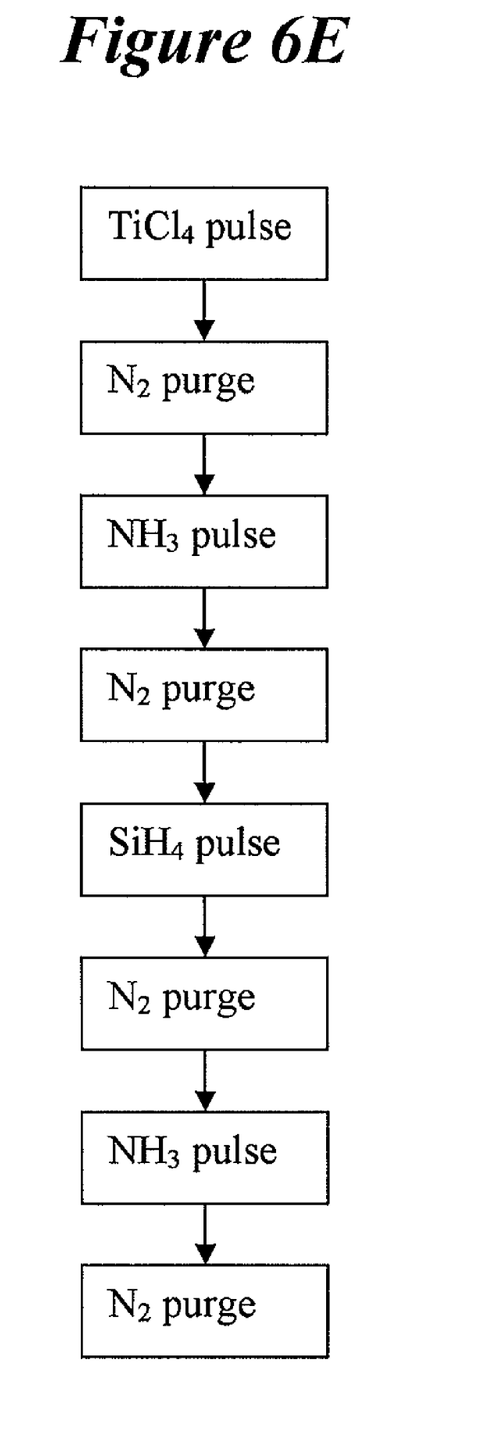

In the sequences shown in FIGS. 6D-6E, $NH_3$ was introduced after the $TiCl_4$ pulse and before a $SiH_4$ pulse. Significant levels of silicon incorporation were found, although deposition rates were lower than the deposition rates resulting from the sequences of FIGS. 4 and 5.

With reference to FIG. 6D, $TiCl_4$, $NH_3$, and $SiH_4$ were separately and sequentially pulsed into a batch reaction chamber. The reaction chamber was purged with $N_2$ between each of these pulses.

With reference to FIG. 6E, the sequence of FIG. 6D was repeated with the addition of a second $NH_3$ pulse and followed by a $N_2$ purge after the $SiH_4$ pulse.

Example 1

Titanium silicon nitride films were formed in an A412™ vertical furnace, commercially available from ASM International, N.V. of Bilthoven, the Netherlands. The furnace was set-up using the reactor hardware configuration of FIG. 3 and a $TiCl_4$ liquid flow control and evaporation unit according to FIG. 2.

Substrates were loaded into a reaction chamber of the furnace. $TiCl_4$, $NH_3$, and $SiH_4$ were sequentially pulsed into the reaction chamber. Each reactant was flowed into the reaction chamber of the furnace using a vertically extending multi-hole injector. The substrates were subjected to 35 deposition cycles at 500° C. and a pressure of 220 mTorr. Each cycle included the following steps:

1) a TiN deposition using $TiCl_4$ and $NH_3$;
2) a reaction chamber purge using $N_2$;

3) a reaction chamber flush using NH$_3$ flowed at a rate greater than the flow rate of NH$_3$ during the TiN deposition;
4) a reaction chamber flush using SiH$_4$; and
5) a reaction chamber purge using N$_2$.

The flow rates and the durations of each steps 1)-5) are given in Table 1 below.

TABLE 1

| Deposition Step | TiCl$_4$ (g/min) | SiH$_4$ (sccm) | NH$_3$ (sccm) | N$_2$ (sccm) | Duration (sec.) |
|---|---|---|---|---|---|
| TiCl$_4$ + NH$_3$ | 2.34 | 0 | 190 | 700 | 28 |
| N$_2$-purge | 0 | 0 | 0 | 400 | 30 |
| NH$_3$ flush | 0 | 0 | 1000 | 300 | 60 |
| SiH$_4$ flush | 0 | 400 | 0 | 400 | 60 |
| N$_2$-purge2 | 0 | 0 | 0 | 400 | 30 |

It will be appreciated that a liquid flow of 2.34 g/min. TiCl$_4$ into the evaporator was applied. In the evaporator, a flow of 400 sccm N$_2$ was added to the liquid and downstream of the evaporator an additional flow of 300 sccm N$_2$ was added to the evaporated TiCl$_4$.

In steps with NH$_3$ or SiH$_4$, the N$_2$ flow rate indicates the flow rate of N$_2$ as a carrier gas added to the flow of the NH$_3$ or SiH$_4$.

The resulting TiSiN films have an average thickness of about 103 Å, as measured by XRR (X-ray reflection), and a sheet resistance of about 1455.7 Ω/sqr. The deposition rate was about 0.84 Å/min.

Example 2

Titanium silicon nitride films were formed as in Example 1 above, except that the duration of the SiH$_4$ flush was increased to 90 s. The flow rates and durations of each of steps 1)-5) are given in Table 2 below. The longer silicon precursor flush resulted in an increased sheet resistance relative to the TiSiN films of Example 1 and higher film thickness. The resulting TiSiN films have an average sheet resistance of about 3064.4 Ω/sqr and an average thickness of about 205 Å. The deposition rate was about 1.46 Å/min.

TABLE 2

| Deposition Step | TiCl$_4$ (g/min) | SiH$_4$ (sccm) | NH$_3$ (sccm) | N$_2$ (sccm) | Duration (sec.) |
|---|---|---|---|---|---|
| TiCl$_4$ + NH$_3$ | 2.34 | 0 | 190 | 700 | 28 |
| N$_2$-purge | 0 | 0 | 0 | 400 | 30 |
| NH$_3$ flush | 0 | 0 | 1000 | 300 | 60 |
| SiH$_4$ flush | 0 | 400 | 0 | 400 | 90 |
| N$_2$-purge2 | 0 | 0 | 0 | 400 | 30 |

It will be appreciated that the resistivity of the deposited TiSiN can be tuned by changing the amount of silicon in the TiSiN film. For example, increasing the number of sub-cycles of silicon precursor, or increasing the duration of silicon precursor exposure relative to the TiN deposition precursors can increase silicon incorporation, which can increase resistivity. Conversely, decreasing the number of sub-cycles of silicon precursor, or decreasing the duration of silicon precursor exposure relative to the TiN deposition precursors can decrease silicon incorporation, which can decrease resistivity.

Figure 7:
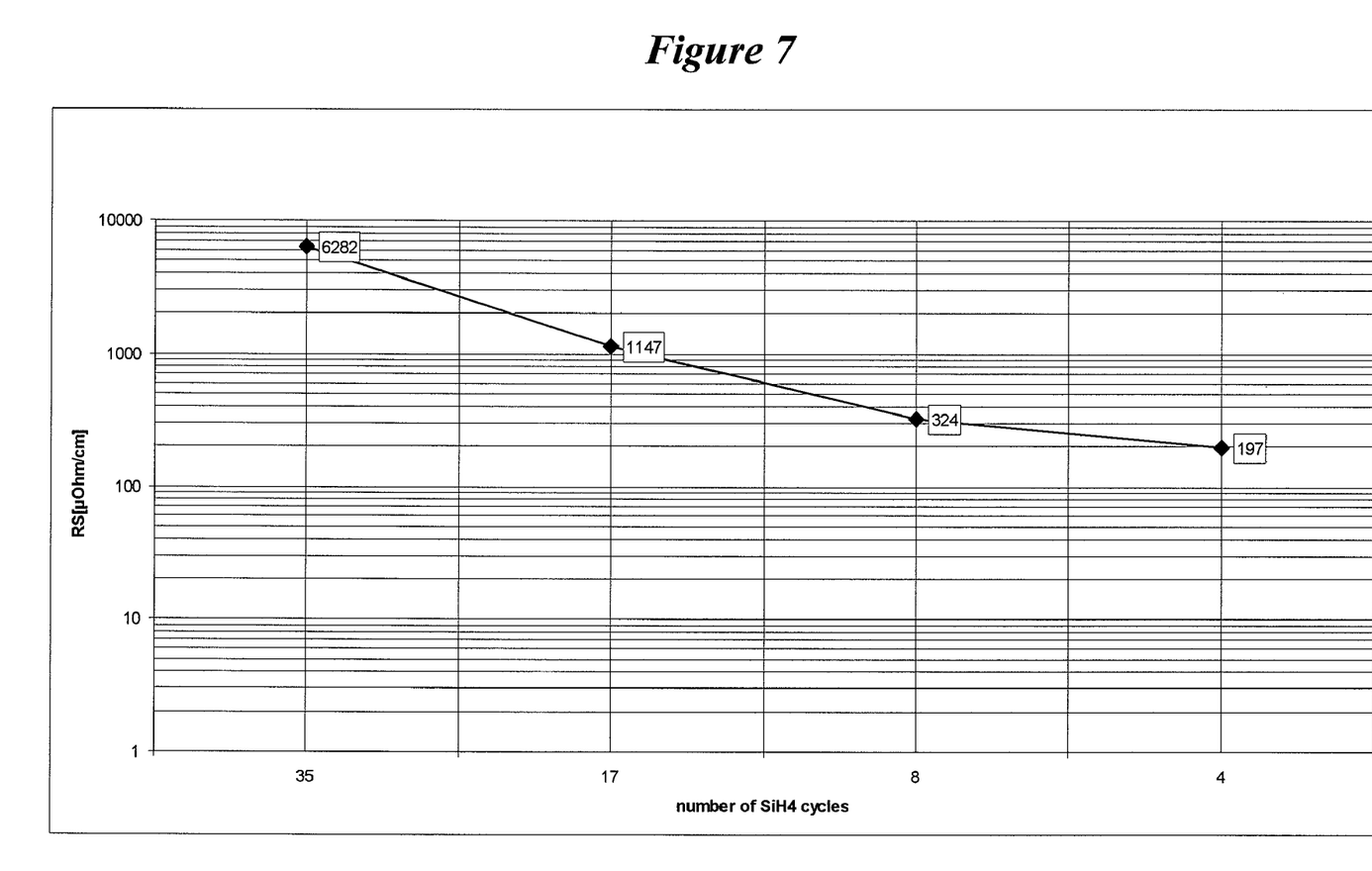
FIG. 7 is a graph showing resistivities of TiSiN films formed with varying levels of exposure to $SiH_4$, according to some embodiments of the invention.

FIG. 7 is a graph showing resistivities of TiSiN films formed with varying levels of exposure to SiH$_4$, according to some embodiments of the invention. The TiSiN was deposited in accordance with Example 2 above, except that the number of SiH$_4$ sub-cycles was varied. The deposition included a total of 35 TiN deposition sub-cycles, each TiN deposition sub-cycle including simultaneously exposing a substrate to TiCl$_4$ and NH$_3$. With the total TiN deposition sub-cycles as a constant, various numbers of total SiH$_4$ sub-cycles (4, 8, 17 and 35) were investigated. Thus, each deposition cycle included at least one TiN sub-cycle, and the number of SiH$_4$ deposition cycles relative to the TiN sub-cycle was varied.

The resistivity increased as the number of SiH$_4$ sub-cycles increased from 4 to 8 to 17 to 35 sub-cycles. Advantageously, varying the number of SiH$_4$ sub-cycles relative to the number of TiN deposition sub-cycles allowed the resistivity to be tuned over a large range, from about 6282 μΩ*cm (35 SiH$_4$ sub-cycles) to about 197 μΩ*cm (4 SiH$_4$ sub-cycles).

Advantageously, as plotted on the illustrated logarithmic graph, the resistitivity increases continuously with increasing number of SiH$_4$ sub-cycles. Thus, the resistivity of the deposited TiSiN can be easily and predictably tuned by selection of the number of SiH$_4$ sub-cycles relative to the number of TiN deposition sub-cycles. In some embodiments, a desired resistivity can be achieved by appropriately selecting the ratio of the flow rates of the titanium, nitrogen and silicon precursors or by appropriately selecting the ratio of the relative number of pulses of the titanium, nitrogen and silicon precursors.

Figure 8:
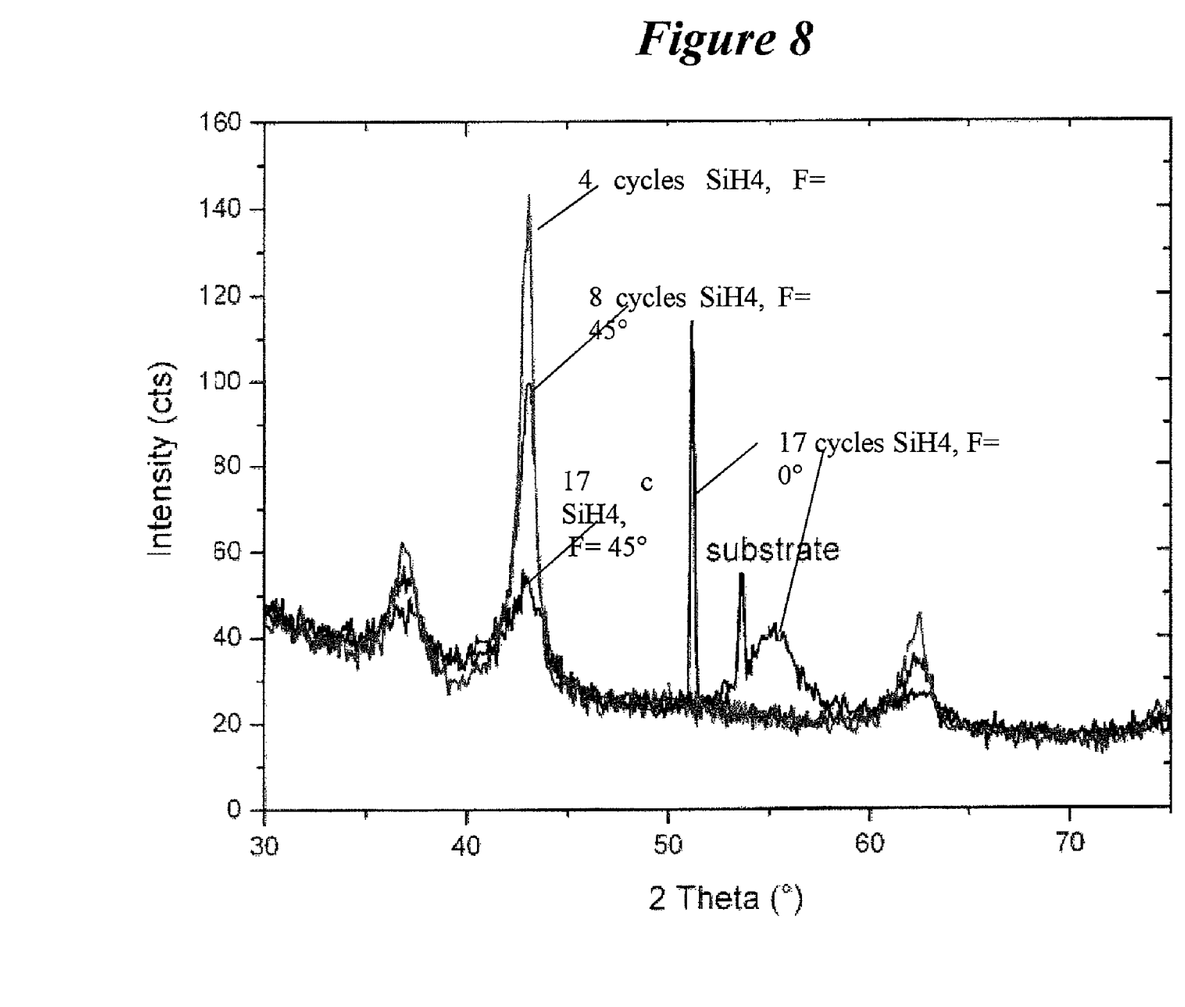
FIG. 8 is a graph showing x-ray diffraction (XRD) scans of TiSiN films formed with varying levels of exposure to $SiH_4$, according to some embodiments of the invention.

FIG. 8 is a graph showing 2 theta x-ray diffraction (XRD) scans of the TiSiN films of FIG. 7. The scans indicate that, as the silicon content increases because of higher numbers of SiH$_4$ sub-cycles relative to TiN deposition sub-cycles, the resulting TiSiN films become more amorphous and the crystallite size decreases. TiSiN films, particularly those that are more amorphous and have smaller crystallite size, can be used as excellent diffusion barriers.

It will be appreciated that various modifications of the above-discussed embodiments are possible. Some non-limiting examples of modifications are noted below.

For example, while the illustrated reactors are shown holding substrates in a vertically-separated manner, the methods described herein can be applied to other batch reactors including, e.g., reactors which hold substrates in a horizontally separated manner. The method described herein can also be applied to reactors with a single or more limited number of points of entry for reactant gases than a vertically-extending multiple hole injector.

Moreover, the duration of the reactant pulses discussed herein can remain the same throughout a deposition, or can vary over the course of the deposition. In some embodiments, the duration of one reactant pulse can vary from that of other reactant pulses over the course of a deposition. In addition, the flow rates and/or quantity of reactant delivered to the reaction chamber can also vary over the course of a deposition. For example, as noted above, in some embodiments, the flow rate of the second pulse of NH$_3$ is increased, relative to the flow rate of the first pulse of NH$_3$ in each cycle. In some embodiments, the duration of the nitrogen precursor pulse can be longer than that of the titanium precursor pulse. For example, for depositing TiN, one nitrogen precursor pulse may extend to temporally overlap multiple titanium precursor pulses.

For separating precursors in some embodiments, various steps discussed herein have been described as purge steps. It will be appreciated that the purge steps are more generally gas or reactant removal steps. As such, in some embodiments, they can encompass evacuation of the process chamber and/or flowing inert gas into the reaction chamber to drive out reactants or other gases already in the reaction chamber.

In some embodiments the deposition temperature can be maintained at a constant value during a deposition. In other embodiments, the deposition temperature is varied over the course of a deposition cycle.

Accordingly, in view of the disclose herein, it will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. A method for forming a titanium silicon nitride film, comprising:
   providing a plurality of semiconductor substrates in a deposition chamber of a batch furnace, wherein the deposition chamber can accommodate 25 or more substrates;
   depositing titanium silicon nitride on the substrates by performing a plurality of deposition cycles, each cycle comprising the following steps:
   A. flowing $TiCl_4$ into the chamber while simultaneously flowing $NH_3$ into the chamber, the $NH_3$ flowing into the chamber at a first flow rate;
   B. stopping the flow of $TiCl_4$;
   C. flowing $NH_3$ into the chamber at a second flow rate higher than the first flow rate; and
   D. flowing a silicon precursor into the chamber.

2. The method of claim 1, wherein the second flow rate is at least about two times the first flow rate.

3. A method for forming a titanium silicon nitride film, comprising:
   providing a plurality of semiconductor substrates in a deposition chamber of a batch furnace, wherein the deposition chamber can accommodate 25 or more substrates;
   depositing titanium silicon nitride on the substrates by performing a plurality of deposition cycles, each cycle comprising the following steps:
   A. flowing $TiCl_4$ into the chamber while simultaneously flowing $NH_3$ into the chamber, the $NH_3$ flowing into the chamber at a first flow rate;
   B. stopping the flow of $TiCl_4$;
   C. flowing $NH_3$ into the chamber at a second flow rate higher than the first flow rate; and
   D. flowing a silicon precursor into the chamber; and
   further comprising:
   providing a desired resistivity for the titanium silicon nitride; and
   selecting a ratio of the step A to the step D based upon the desired resistivity.

4. The method of claim 1, wherein steps A, B, and C are repeated one or more times before performing step D.

5. The method of claim 1, wherein step A comprises thermally decomposing the $TiCl_4$ and the $NH_3$ on the semiconductor substrates.

6. The method of claim 1, wherein depositing titanium silicon nitride is performed at a deposition temperature of about 400° C. or more.

7. The method of claim 6, wherein the deposition temperature is about 500° C. or more.

8. The method of claim 1, wherein flowing $NH_3$ into the chamber at the first flow rate while simultaneously flowing $TiCl_4$ into the chamber deposits a titanium nitride layer having a thickness of about 2 Å or more per cycle.

9. The method of claim 1, further comprising purging the chamber with inert gas after each of the steps B, C, and D.

* * * * *